United States Patent
Kanematsu et al.

(10) Patent No.: US 11,127,743 B2
(45) Date of Patent: Sep. 21, 2021

(54) TRANSISTOR, SEMICONDUCTOR DEVICE, ELECTRONIC APPARATUS, AND METHOD FOR PRODUCING TRANSISTOR

(71) Applicant: SONY CORPORATION, Tokyo (JP)

(72) Inventors: Shigeru Kanematsu, Kanagawa (JP); Katsuhiko Takeuchi, Kanagawa (JP); Masashi Yanagita, Kanagawa (JP); Shinichi Wada, Kanagawa (JP)

(73) Assignee: SONY CORPORATION, Tokyo (JP)

(*) Notice: Subject to any disclaimer, the term of this patent is extended or adjusted under 35 U.S.C. 154(b) by 234 days.

(21) Appl. No.: 15/781,301

(22) PCT Filed: Nov. 4, 2016

(86) PCT No.: PCT/JP2016/082867
§ 371 (c)(1),
(2) Date: Jun. 4, 2018

(87) PCT Pub. No.: WO2017/110267
PCT Pub. Date: Jun. 29, 2017

(65) Prior Publication Data
US 2018/0358359 A1    Dec. 13, 2018

(30) Foreign Application Priority Data

Dec. 24, 2015 (JP) .............................. JP2015-251131

(51) Int. Cl.
*H01L 27/098* (2006.01)
*H01L 29/417* (2006.01)
(Continued)

(52) U.S. Cl.
CPC .......... *H01L 27/098* (2013.01); *H01L 29/417* (2013.01); *H01L 29/41766* (2013.01);
(Continued)

(58) Field of Classification Search
CPC ............... H01L 29/7787; H01L 27/098; H01L 29/41766; H01L 29/786; H01L 29/417;
(Continued)

(56) References Cited

U.S. PATENT DOCUMENTS 9,601,610 B1*   3/2017   Khalil ................ H01L 29/7789
2010/0210080 A1   8/2010   Nomura et al.
(Continued)

FOREIGN PATENT DOCUMENTS

JP    01-184957 A    7/1989
JP    04-206766 A    7/1992
(Continued)

OTHER PUBLICATIONS

International Search Report and Written Opinion of PCT Application No. PCT/JP2016/082867, dated Jan. 31, 2017, 12 pages of ISRWO.

*Primary Examiner* — Benjamin Tzu-Hung Liu
(74) *Attorney, Agent, or Firm* — Chip Law Group

(57) ABSTRACT

A transistor including a carrier transit layer that includes a compound semiconductor and a carrier supply layer in contact with the carrier transit layer. The carrier supply layer includes a compound semiconductor of a different type from the carrier transit layer. The transistor includes a gate electrode provided on the carrier supply layer, and a source electrode and a drain electrode provided on another surface of the carrier transit layer that is opposite to one surface on which the carrier supply layer is provided.

14 Claims, 9 Drawing Sheets

(51) Int. Cl.
  *H01L 29/778* (2006.01)
  *H01L 29/786* (2006.01)
  *H01L 29/808* (2006.01)
  *H01L 29/812* (2006.01)
  *H01L 29/06* (2006.01)
  *H01L 29/423* (2006.01)
  *H01L 29/08* (2006.01)
  *H01L 29/10* (2006.01)
  *H01L 29/20* (2006.01)

(52) U.S. Cl.
  CPC ........ *H01L 29/778* (2013.01); *H01L 29/7787* (2013.01); *H01L 29/786* (2013.01); *H01L 29/808* (2013.01); *H01L 29/812* (2013.01); *H01L 29/0653* (2013.01); *H01L 29/0843* (2013.01); *H01L 29/1066* (2013.01); *H01L 29/2003* (2013.01); *H01L 29/4236* (2013.01); *H01L 29/42316* (2013.01)

(58) Field of Classification Search
  CPC ... H01L 29/778; H01L 29/808; H01L 29/812; H01L 29/0653; H01L 29/42316; H01L 29/0843; H01L 29/1066; H01L 29/4236; H01L 29/2003
  See application file for complete search history.

(56) References Cited

U.S. PATENT DOCUMENTS

| 2011/0062448 A1* | 3/2011 | Hong ................ H01L 29/66462 257/76 |
| 2012/0043586 A1* | 2/2012 | Nishimori .......... H01L 29/0657 257/194 |
| 2012/0080724 A1* | 4/2012 | Iwabuchi .......... H01L 29/42316 257/194 |
| 2016/0064502 A1* | 3/2016 | Oka .................. H01L 29/66462 257/411 |

FOREIGN PATENT DOCUMENTS

| JP | 2000-323498 A | | 11/2000 |
| JP | 2002-359256 A | | 12/2002 |
| JP | 2004-273486 A | | 9/2004 |
| JP | 2004273486 | * | 9/2004 |
| JP | 2010-192633 A | | 9/2010 |
| JP | 2012-044113 A | | 3/2012 |
| JP | 2015-228459 A | | 12/2015 |
| JP | 2015228459 | * | 12/2015 |

* cited by examiner

TRANSISTOR, SEMICONDUCTOR DEVICE, ELECTRONIC APPARATUS, AND METHOD FOR PRODUCING TRANSISTOR

CROSS REFERENCE TO RELATED APPLICATIONS

This application is a U.S. National Phase of International Patent Application No. PCT/JP2016/082867 filed on Nov. 4, 2016, which claims priority benefit of Japanese Patent Application No. JP 2015-251131 filed in the Japan Patent Office on Dec. 24, 2015. Each of the above-referenced applications is hereby incorporated herein by reference in its entirety.

TECHNICAL FIELD

The present disclosure relates to a transistor, a semiconductor device, an electronic apparatus, and a method for producing a transistor.

BACKGROUND ART

In recent years, a high electron mobility transistor (HEMT) has been attracting attention as a transistor using a compound semiconductor.

A high electron mobility transistor is a field-effect transistor in which a layer including two-dimensional electron gas induced by a semiconductor heterojunction is used as a channel. Examples of a structure of a high electron mobility transistor include a structure described in Patent Literature 1 below.

CITATION LIST

Patent Literature

Patent Literature 1: JP 2002-359256A

DISCLOSURE OF INVENTION

Technical Problem

However, in a high electron mobility transistor using a compound semiconductor, it has been difficult to reduce contact resistance between a source electrode and a drain electrode, and a channel. This is because in the high electron mobility transistor, a carrier supply layer in contact with the source electrode and the drain electrode has a large band gap, resulting in a high Schottky barrier.

In addition, a compound semiconductor has a higher melting point than silicon and the like; therefore, it has also been difficult to reduce contact resistance by formation of a diffusion layer by high-concentration doping, formation of an alloy layer by alloying, or the like as with silicon.

Hence, the present disclosure proposes a novel and improved transistor, semiconductor device, electronic apparatus, and method for producing a transistor capable of reducing parasitic resistance including contact resistance.

Solution to Problem

According to the present disclosure, there is provided a transistor including: a carrier transit layer including a compound semiconductor; a carrier supply layer provided on and in contact with the carrier transit layer and including a compound semiconductor of a different type from the carrier transit layer; a gate electrode provided on the carrier supply layer; and a source electrode and a drain electrode provided on another surface of the carrier transit layer that is opposite to one surface on which the carrier supply layer is provided.

In addition, according to the present disclosure, there is provided a semiconductor device including a transistor including a carrier transit layer including a compound semiconductor, a carrier supply layer provided on and in contact with the carrier transit layer and including a compound semiconductor of a different type from the carrier transit layer, a gate electrode provided on the carrier supply layer, and a source electrode and a drain electrode provided on another surface of the carrier transit layer that is opposite to one surface on which the carrier supply layer is provided.

In addition, according to the present disclosure, there is provided an electronic apparatus including a transistor including a carrier transit layer including a compound semiconductor, a carrier supply layer provided on and in contact with the carrier transit layer and including a compound semiconductor of a different type from the carrier transit layer, a gate electrode provided on the carrier supply layer, and a source electrode and a drain electrode provided on another surface of the carrier transit layer that is opposite to one surface on which the carrier supply layer is provided.

Furthermore, according to the present disclosure, there is provided a method for producing a transistor, including: stacking a carrier transit layer and a carrier supply layer including compound semiconductors of different types in sequence on a substrate; forming a gate electrode on the carrier supply layer; removing the substrate; and forming a source electrode and a drain electrode on another surface of the carrier transit layer that is opposite to one surface on which the carrier supply layer is provided.

According to the present disclosure, contact resistance between a source electrode and a drain electrode, and a two-dimensional electron gas layer serving as a channel can be reduced.

Advantageous Effects of Invention

As described above, according to the present disclosure, a transistor, a semiconductor device, and an electronic apparatus with reduced parasitic resistance can be provided.

Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
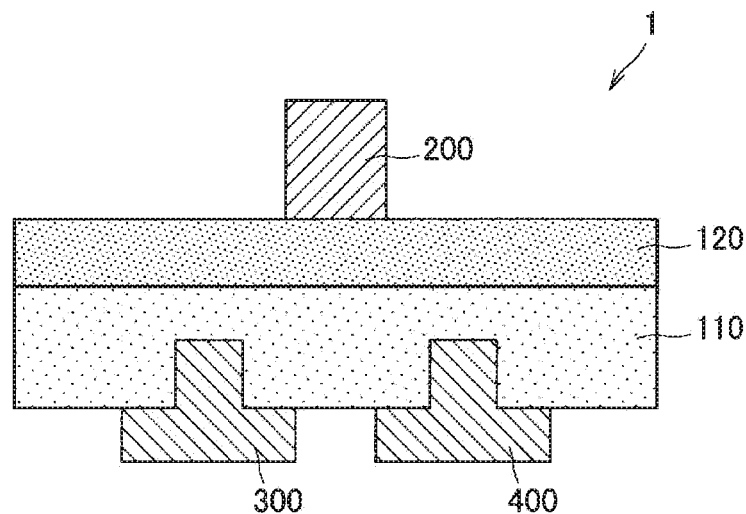
FIG. 1 is a cross-sectional view of a basic stacked structure of a transistor according to a first embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be given in the following order.
0. Technical background of present disclosure
1. First Embodiment
1.1. Structure of transistor
1.2. Method for producing transistor
1.3. Modification examples
2. Second Embodiment
3. Third Embodiment
4. Fourth Embodiment
5. Fifth Embodiment
6. Conclusion

0. TECHNICAL BACKGROUND OF PRESENT DISCLOSURE

Figure 17:
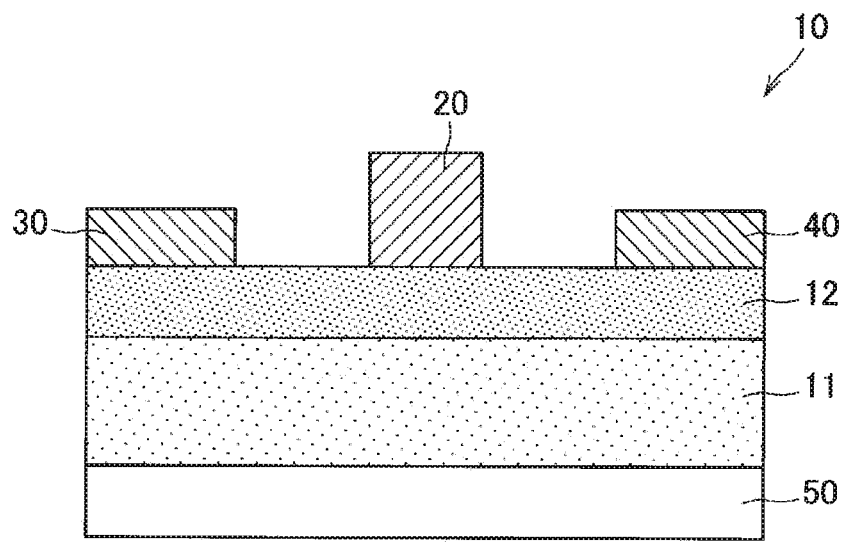
FIG. 17 is a cross-sectional view of a stacked structure of a compound semiconductor transistor according to a comparative example.

First, the technical background of the present disclosure is described with reference to FIG. 17. FIG. 17 is a cross-sectional view of a stacked structure of a compound semiconductor transistor according to a comparative example.

As illustrated in FIG. 17, a compound semiconductor transistor 10 according to the comparative example includes a carrier transit layer 11 stacked on a substrate 50, a carrier supply layer 12 stacked on the carrier transit layer 11, and a gate electrode 20, a source electrode 30, and a drain electrode 40 provided on the carrier supply layer 12.

The substrate 50 includes, for example, silicon (Si), silicon carbide (SiC), gallium nitride (GaN), sapphire, or the like. Note that although not illustrated, in the case where the substrate 50 and the carrier transit layer 11 greatly differ in lattice constant, a buffer layer whose lattice constant is appropriately controlled for causing epitaxial growth of the carrier transit layer 11 is provided between the substrate 50 and the carrier transit layer 11.

The carrier transit layer 11 includes an i-type (i.e., undoped) compound semiconductor, and the carrier supply layer 12 includes an n-type compound semiconductor. In addition, the carrier transit layer 11 and the carrier supply layer 12 include compound semiconductors that have lattice constants close enough to allow epitaxial growth and have different band gap sizes. Consequently, at an interface between the carrier transit layer 11 and the carrier supply layer 12 having different band gap sizes, the conduction band and the valence band are each discontiguous.

Here, in the case where the carrier transit layer 11 has a smaller band gap size than the carrier supply layer 12, electrons caused from a donor of the carrier supply layer 12 gather in the vicinity of the interface of the carrier transit layer 11 having a larger electron affinity. Therefore, in the vicinity of the interface of the carrier transit layer 11 with the carrier supply layer 12, an electron layer also called a two-dimensional electron gas layer is formed by concentrated electrons.

Since the carrier transit layer 11 in which the two-dimensional electron gas layer is formed is of an i-type (i.e., undoped), the two-dimensional electron gas layer can function as a high-mobility channel with little impurity scattering. Note that a compound semiconductor transistor using such a two-dimensional electron gas layer as a channel is also called a high electron mobility transistor (HEMT).

Examples of a combination of materials of the carrier transit layer 11 and the carrier supply layer 12 that form such a heterojunction include a combination of GaAs and AlGaAs, a combination of GaN and AlGaN, a combination of GaAs and InGaP, a combination of GaN and AlInN, and the like.

The gate electrode 20 is formed using a metal containing nickel (Ni), titanium (Ti), gold (Au), and the like. In addition, the gate electrode 20 forms a Schottky junction with the carrier supply layer 12, and the Schottky junction forms a depletion layer extending from the gate electrode 20 side in the carrier supply layer 12.

Therefore, electron concentration of the two-dimensional electron gas layer can be controlled by an electric field effect, by changing voltage applied to the gate electrode 20 to control a thickness of the depletion layer formed in the carrier supply layer 12. Such control enables the compound semiconductor transistor 10 according to the comparative example to function as a field-effect transistor using the two-dimensional electron gas layer as a channel.

The source electrode 30 and the drain electrode 40 are formed using a metal containing titanium (Ti), aluminum (Al), and the like. In addition, the source electrode 30 and the drain electrode 40 are formed so as to form an ohmic junction with the two-dimensional electron gas layer in the carrier transit layer 11.

Here, in the compound semiconductor transistor 10, contact resistance between the source electrode 30 and the drain electrode 40, and the two-dimensional electron gas layer in the carrier transit layer 11 is high. This is because the carrier supply layer 12 in contact with the source electrode 30 and the drain electrode 40 has a large band gap, resulting in a high Schottky barrier between the source electrode 30 and the drain electrode 40, and the carrier supply layer 12. That is, the intervention of the carrier supply layer 12 with the high Schottky barrier makes contact resistance from the source electrode 30 and the drain electrode 40 to the two-dimensional electron gas layer high.

For example, in a silicon transistor, contact resistance is reduced by lowering the Schottky barrier by increasing impurity concentration of a silicon layer by ion implantation or the like. In addition, in a silicon transistor, contact resistance is reduced by alloying a metal forming a source electrode and a drain electrode with silicon of a silicon layer (forming a silicide).

However, in the compound semiconductor transistor 10, it has been difficult to apply the above-described techniques used in a silicon transistor in order to reduce contact resistance.

Specifically, in the case of applying the above-described activation technique used in a silicon transistor to the compound semiconductor transistor 10, it is necessary to increase temperature of heat treatment. In addition, although only a surface of a silicon layer that is in contact with a source electrode and a drain electrode may be reduced in resistance in a silicon transistor, the entire carrier supply layer 12 needs to be reduced in resistance in the compound semiconductor transistor 10; thus, a reaction layer needs to be formed deep, which requires heat treatment for a long time or heat treatment at high temperature. In addition, for application of the silicide technology used in a silicon transistor, few examples have been reported regarding an appropriate metal material to be alloyed with a compound semiconductor.

Consequently, in the case where heat treatment at high temperature is performed for a long time in the compound semiconductor transistor 10, elements are mutually diffused at the hetero interface between the carrier transit layer 11 and the carrier supply layer 12, which causes the hetero interface to deteriorate. In such a case, carrier mobility of the channel of the compound semiconductor transistor 10 decreases, which degrades characteristics of the compound semiconductor transistor 10. Therefore, it has been difficult to apply the above-described techniques used in a silicon transistor to the compound semiconductor transistor 10.

Hence, in the compound semiconductor transistor 10, in order to reduce contact resistance between the source electrode 30 and the drain electrode 40, and the carrier transit layer 11, removal or thinning of the carrier supply layer 12 directly under the source electrode 30 and the drain electrode 40 has been proposed.

However, in the case where the carrier supply layer 12 directly under the source electrode 30 and the drain electrode 40 is completely removed, the source electrode 30 and the drain electrode 40 are electrically connected to the two-dimensional electron gas layer at a side face of each electrode. In such a case, connection between the source electrode 30 and the drain electrode 40 and the two-dimensional electron gas layer is point contact, which may increase contact resistance or destabilize connection.

In addition, in the case of thinning the carrier supply layer 12 directly under the source electrode 30 and the drain electrode 40, it has been difficult to uniformly thin the carrier supply layer 12 by etching or the like. This is because the carrier supply layer 12 has large film thickness variation, and etching variation in removing the carrier supply layer 12 is large, resulting in large remaining film variation of the carrier supply layer 12 after etching.

Consequently, in the compound semiconductor transistor 10, it has been difficult to reduce contact resistance between the source electrode 30 and the drain electrode 40, and the two-dimensional electron gas layer formed in the carrier transit layer 11.

Note that as another structure of the compound semiconductor transistor 10, a structure in which the stacking order of the carrier transit layer 11 and the carrier supply layer 12 is inverted, and the source electrode 30 and the drain electrode 40, and the carrier transit layer 11 are arranged to be in contact with each other (so-called inverted HEMT structure) has been proposed.

In a compound semiconductor transistor having such an inverted HEMT structure, the source electrode 30 and the drain electrode 40 are in direct contact with the carrier transit layer 11; thus, contact resistance can be reduced as compared with the compound semiconductor transistor 10 illustrated in FIG. 17. However, in the compound semiconductor transistor with the inverted HEMT structure, since the gate electrode 20 is in direct contact with the carrier transit layer 11, it has been difficult to appropriately control concentration of two-dimensional electron gas as compared with the compound semiconductor transistor 10 illustrated in FIG. 17. Consequently, in the case where the inverted HEMT structure is employed in order to reduce contact resistance in the compound semiconductor transistor 10, operation as a transistor becomes unstable.

The present inventors have arrived at the technology according to the present disclosure by studying the above circumstances. A transistor according to an embodiment of the present disclosure has a novel and improved structure to reduce contact resistance between a source electrode and a drain electrode, and a two-dimensional electron gas layer serving as a channel, thereby reducing parasitic resistance of the transistor.

The above-described transistor according to an embodiment of the present disclosure is described in detail below.

1. FIRST EMBODIMENT

1.1. Structure of Transistor

First, a structure of a transistor according to a first embodiment of the present disclosure will be described with reference to FIG. 1. FIG. 1 is a cross-sectional view of a basic stacked structure of a transistor 1 according to the present embodiment.

As illustrated in FIG. 1, the transistor 1 according to the present embodiment includes a carrier transit layer 110, a carrier supply layer 120 provided on the carrier transit layer 110, a gate electrode 200 provided on the carrier supply layer 120, and a source electrode 300 and a drain electrode 400 provided on another surface of the carrier transit layer 110 that is opposite to one surface on which the carrier supply layer 120 is provided.

The carrier transit layer 110 includes, for example, an i-type (i.e., undoped) compound semiconductor. The carrier supply layer 120 includes, for example, a first-conductivity-type (e.g., n-type) compound semiconductor that has a lattice constant close enough to that of the carrier transit layer 110 to allow epitaxial growth and has a large band gap. In addition, the carrier transit layer 110 and the carrier supply layer 120 are provided adjacent to each other. Thus, at an interface between the carrier transit layer 110 and the carrier supply layer 120, the conduction band and the valence band are each discontiguous, so that a two-dimensional electron gas layer is formed in the vicinity of the interface of the carrier transit layer 110.

For example, the carrier transit layer 110 may include GaN, and the carrier supply layer 120 may include AlGaN. Note that the carrier transit layer 110 and the carrier supply layer 120 may include a combination of other compound semiconductors, as long as the two-dimensional electron gas layer is formed. For example, the carrier transit layer 110 and the carrier supply layer 120 may include a combination of GaAs and AlGaAs, a combination of GaAs and InGaP, and a combination of GaN and AlInN. In addition, depending on the compound semiconductor (e.g., in the case of AlGaN or the like), the carrier supply layer 120 may be of an i-type (i.e., undoped).

The gate electrode 200 is provided on a surface of the carrier supply layer 120 that is opposite to a surface on which the carrier transit layer 110 is provided. In addition, the gate electrode 200 includes a metal capable of forming a Schottky junction with the carrier supply layer 120. For example, the gate electrode 200 may be formed using a stack of Ni and Au.

The source electrode 300 and the drain electrode 400 are provided on the other surface of the carrier transit layer 110 that is opposite to the one surface on which the carrier supply layer 120 is provided. That is, in the transistor 1 according to the present embodiment, the gate electrode 200, and the source electrode 300 and the drain electrode 400 are provided on different surfaces opposite to each other. In addition, the source electrode 300 and the drain electrode 400 include a metal capable of forming an ohmic junction with the carrier transit layer 110. For example, the source electrode 300 and the drain electrode 400 may be formed using a stack of Ti and Al.

In addition, the other surface of the carrier transit layer 110 may be provided with recesses, and the recesses may be embedded by the source electrode 300 and the drain electrode 400. Such a configuration can further shorten a distance between the source electrode 300 and the drain electrode 400, and the two-dimensional electron gas layer formed in the carrier transit layer 110, which can further reduce contact resistance.

Note that the source electrode 300 and the drain electrode 400 may be alloyed with a contact surface of the carrier transit layer 110, by being formed by stacking metals such as Ti, Al, Ni, and Au and then being subjected to alloying treatment. Such a configuration can further lower a Schottky barrier between the source electrode 300 and the drain electrode 400, and the carrier transit layer 110, which can further reduce contact resistance.

An inclination of a barrier at the hetero interface between the carrier transit layer 110 and the carrier supply layer 120 in the compound semiconductor transistor is steep on the carrier supply layer 120 side, but is gentle on the carrier transit layer 110 side. Therefore, providing the source electrode 300 and the drain electrode 400 on the other surface of the carrier transit layer 110 that is opposite to the one surface on which the carrier supply layer 120 is provided makes it possible to reduce contact resistance between the source electrode 300 and the drain electrode 400, and the two-dimensional electron gas layer, without changing a thickness of the carrier supply layer 120.

Particularly in the case where the carrier transit layer 110 includes GaN and the carrier supply layer 120 includes AlGaN, thickening the carrier supply layer 120 can increase electron concentration of two-dimensional atomic gas by a piezoelectric effect. In the transistor 1 according to the present embodiment, there is no need to thin the carrier supply layer 120 in order to reduce contact resistance of the source electrode 300 and the drain electrode 400; therefore, the transistor 1 can be suitably used as a compound semiconductor transistor using GaN and AlGaN.

In addition, in the transistor 1 according to the present embodiment, the source electrode 300 and the drain electrode 400, and the two-dimensional electron gas layer can form a conduction path by the entire bottom faces of the source electrode 300 and the drain electrode 400. Consequently, the transistor 1 according to the present embodiment can further reduce contact resistance of the source electrode 300 and the drain electrode 400.

Furthermore, in the transistor 1 according to the present embodiment, since the gate electrode 200, and the source electrode 300 and the drain electrode 400 are provided on different surfaces opposite to each other, a planar area of the transistor 1 can be reduced as compared with a case where the electrodes are provided on the same surface. This is because in the transistor 1 according to the present embodiment, spacing between the gate electrode 200, and the source electrode 300 and the drain electrode 400 provided on a different surface can be made smaller than a design rule (minimum feature size) determined by a production process.

Furthermore, in the transistor 1 according to the present embodiment, since the gate electrode 200, and the source electrode 300 and the drain electrode 400 are provided on different surfaces opposite to each other, parasitic capacitance can be reduced as compared with a case where the electrodes are provided on the same surface.

Specifically, in the transistor 1 according to the present embodiment, spacing between the gate electrode 200, and the source electrode 300 and the drain electrode 400 is substantially equal to a thickness of the transistor 1 in a stacking direction. Consequently, in the transistor 1 according to the present embodiment, a distance between the gate electrode and the source electrode, and a distance between the gate electrode and the drain electrode can be made longer, which can reduce parasitic capacitance between these electrodes. Thus, the transistor 1 according to the present embodiment with reduced parasitic capacitance can perform operation at higher speed.

Figure 2:
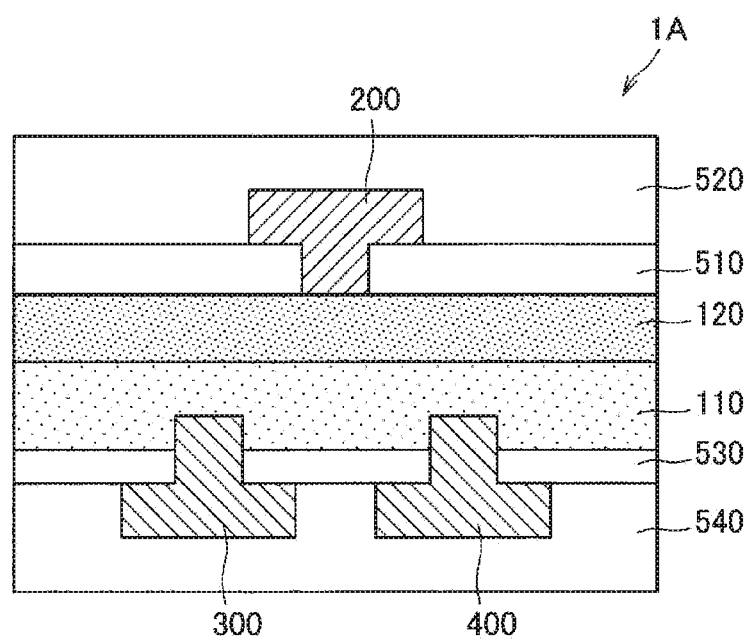
FIG. 2 is a cross-sectional view of a more specific stacked structure of the transistor according to the embodiment.

Now, a more specific structure of a transistor 1A according to the present embodiment will be described with reference to FIG. 2. FIG. 2 is a cross-sectional view of a more specific stacked structure of the transistor 1A according to the present embodiment.

As illustrated in FIG. 2, the transistor 1A has a structure in which, as compared with the transistor 1 illustrated in FIG. 1, the gate electrode 200, the source electrode 300, and the drain electrode 400 are embedded by a first interlayer film 510, a second interlayer film 520, a third interlayer film 530, and a fourth interlayer film 540. Note that the configuration excluding the first interlayer film 510, the second interlayer film 520, the third interlayer film 530, and the fourth interlayer film 540 is similar to that of the transistor 1 illustrated in FIG. 1; thus, description is omitted here.

The first interlayer film 510, the second interlayer film 520, the third interlayer film 530, and the fourth interlayer film 540 include a material having insulation properties. For example, the first interlayer film 510, the second interlayer film 520, the third interlayer film 530, and the fourth interlayer film 540 may be formed with a single-layer structure or a stacked structure using SiN, $Si_3N_4$, SiO, $SiO_2$, $Al_2O_3$, or the like.

The first interlayer film 510, the second interlayer film 520, the third interlayer film 530, and the fourth interlayer film 540 can embed the electrodes to protect the electrodes from external environment. In addition, the first interlayer film 510, the second interlayer film 520, the third interlayer film 530, and the fourth interlayer film 540 can insulate the embedded electrodes and wirings from each other; therefore, another electrode, wiring, terminal, or the like can be formed on each interlayer film.

1.2. Method for Producing Transistor

Next, a method for producing the transistor 1A according to the present embodiment is described with reference to FIGS. 3 to 8. FIGS. 3 to 8 are cross-sectional views of production steps of the transistor 1A illustrated in FIG. 2.

Figure 3:
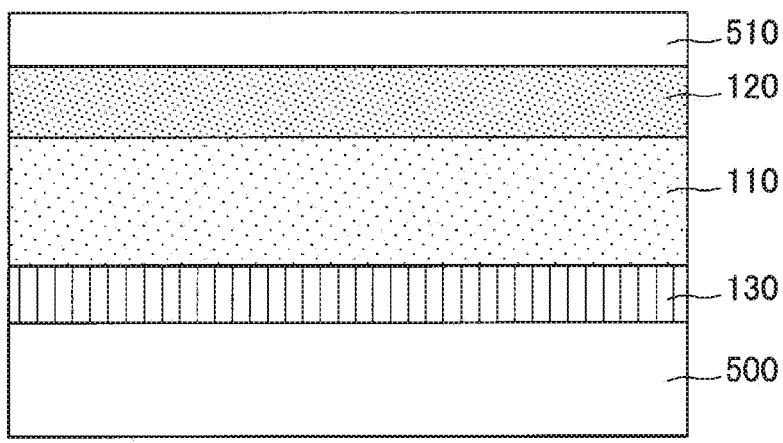
FIG. 3 is a cross-sectional view of a production step of the transistor illustrated in FIG. 2.

First, as illustrated in FIG. 3, a buffer layer 130 is stacked on a substrate 500 by metal organic chemical vapor deposition (MOCVD), molecular beam epitaxy (MBE), or the like.

The substrate 500 is, for example, a silicon (Si) substrate. In addition, the substrate 500 may be a silicon carbide (SiC) substrate, a gallium nitride (GaN) substrate, a sapphire substrate, a diamond substrate, a gallium arsenide (GaAs) substrate, or the like. Note that the substrate 500 may include a material different from those of the carrier transit layer 110 and the carrier supply layer 120 to be stacked on the substrate 500. In such a case, the substrate 500 can be easily removed in a step described later.

The buffer layer 130, which includes a compound semiconductor, is a layer for causing epitaxial growth of the carrier transit layer 110 and the carrier supply layer 120 on the substrate 500. Specifically, in the case where the substrate 500 and the carrier transit layer 110 greatly differ in lattice constant, the buffer layer 130 has its lattice constant appropriately controlled to make the carrier transit layer 110 have a favorable crystalline state. For example, in the case where the substrate 500 is a Si substrate and the carrier transit layer 110 is formed using GaN, a single layer of AN, AlGaN, or GaN, a stacked structure of these, or the like can be used as the buffer layer 130.

Subsequently, the carrier transit layer 110 and the carrier supply layer 120 are stacked in sequence by epitaxial growth on the buffer layer 130 by MOCVD, MBE, or the like. For example, the carrier transit layer 110 may be formed using GaN, and the carrier supply layer 120 may be formed using AlGaN.

Here, although not illustrated, a step of element isolation may be performed to isolate elements, such as the transistor, on the substrate 500. Specifically, ion implantation of a second-conductivity-type impurity (boron or the like) may be performed on the carrier supply layer 120 to form a non-active region with increased resistance, thereby isolating the elements on the substrate 500. In addition, the elements on the substrate 500 may be isolated by removing the carrier supply layer 120 by etching or the like to remove the hetero interface forming the two-dimensional electron gas layer.

Next, the first interlayer film 510 is stacked on the carrier supply layer 120 by chemical vapor deposition (CVD) or the like. The first interlayer film 510 may be formed as, for example, a single-layer film of SiN, $Si_3N_4$, SiO, $SiO_2$, $Al_2O_3$, or the like, or a stacked film of these.

Figure 4:
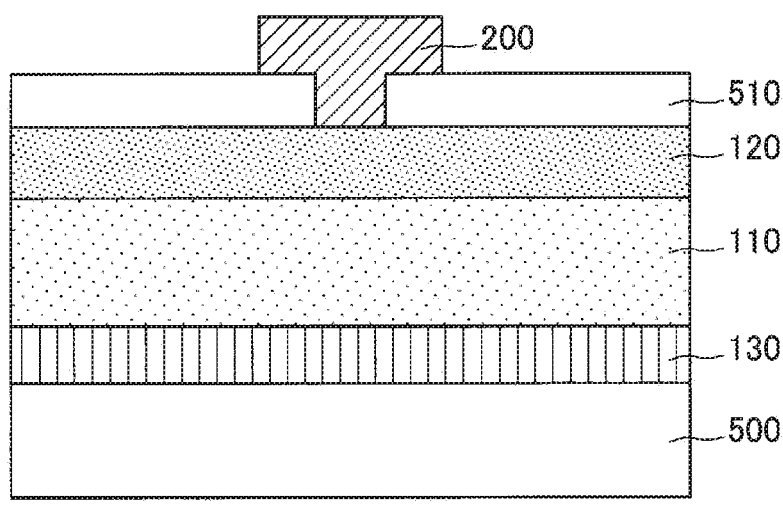
FIG. 4 is a cross-sectional view of a production step of the transistor illustrated in FIG. 2.

Subsequently, as illustrated in FIG. 4, an opening is formed in a partial region of the first interlayer film 510 by photolithography and etching, metals such as Ni and Au are stacked in the opening, and then patterning is performed, so that the gate electrode 200 is formed. Thus, a Schottky junction is formed between the gate electrode 200 and the carrier supply layer 120.

Figure 5:
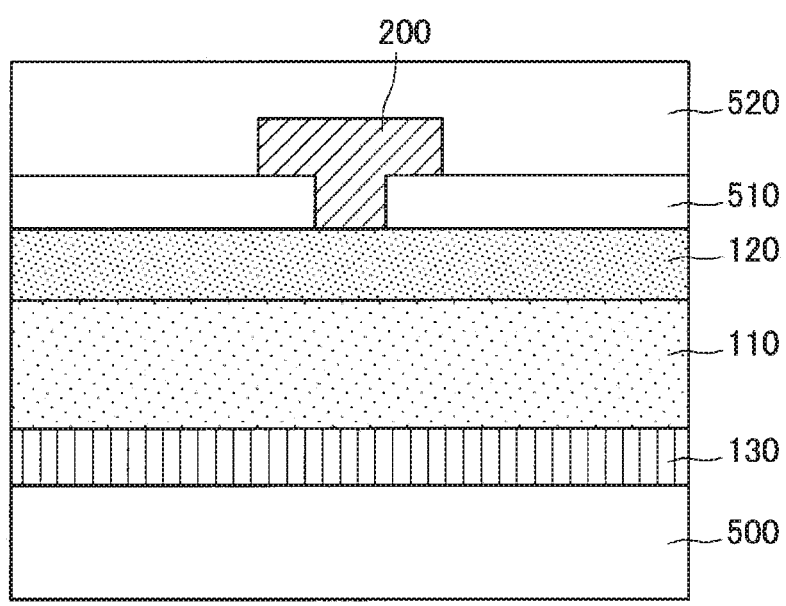
FIG. 5 is a cross-sectional view of a production step of the transistor illustrated in FIG. 2

Next, as illustrated in FIG. 5, on the gate electrode 200, the second interlayer film 520 is stacked over the entire surface by CVD or the like. Like the first interlayer film 510, the second interlayer film 520 may be formed as, for example, a single-layer film of SiN, $Si_3N_4$, SiO, $SiO_2$, $Al_2O_3$, or the like, or a stacked film of these. Note that various wirings (not illustrated) may be formed in the second interlayer film 520 as needed.

Figure 6:
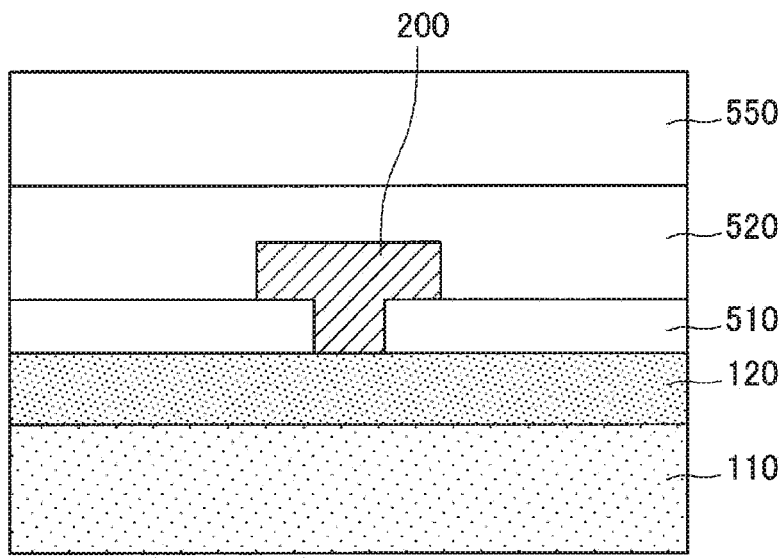
FIG. 6 is a cross-sectional view of a production step of the transistor illustrated in FIG. 2

Subsequently, as illustrated in FIG. 6, a support substrate 550 is attached on the second interlayer film 520, then front and back are inverted, and the substrate 500 and the buffer layer 130 are removed and, furthermore, the carrier transit layer 110 is thinned to an appropriate film thickness by chemical mechanical polishing (CMP) or the like. The film thickness of the carrier transit layer 110 influences contact resistance between the source electrode 300 and the drain electrode 400, and the two-dimensional electron gas layer; hence, the film thickness of the thinned carrier transit layer 110 is preferably thin to the extent that strength can be maintained. In addition, the support substrate 550 may be any substrate, and a substrate similar to the substrate 500 may be used.

Note that the step illustrated in FIG. 6 can be performed also by a method other than the above. For example, in the case where the substrate 500 is a silicon substrate, the substrate 500 and the buffer layer 130 may be removed and the carrier transit layer 110 may be thinned in the following manner: after the support substrate 550 is attached on the second interlayer film 520, wet etching using an alkaline solution (e.g., KOH) or the like is performed with the support substrate 550 side protected by a resist or the like. In addition, in the case where the substrate 500 is a sapphire substrate or the like, the substrate 500 may be peeled off by laser lift-off.

Figure 7:
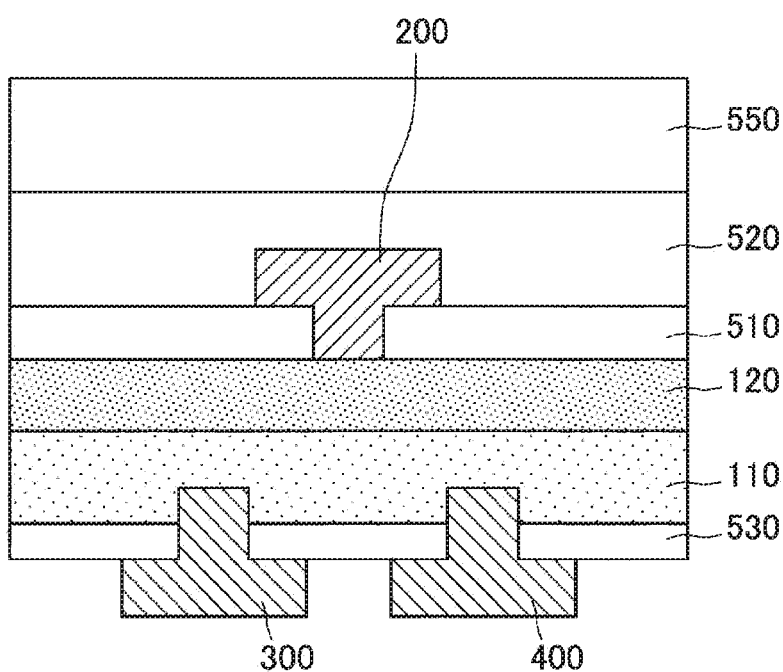
FIG. 7 is a cross-sectional view of a production step of the transistor illustrated in FIG. 2.

Next, as illustrated in FIG. 7, the third interlayer film 530 is formed by CVD or the like on a surface of the carrier transit layer 110 that has been exposed by removal of the substrate 500 and the buffer layer 130. Note that, like the first interlayer film 510, the third interlayer film 530 may be formed as, for example, a single-layer film of SiN, $Si_3N_4$, SiO, $SiO_2$, $Al_2O_3$, or the like, or a stacked film of these.

Subsequently, an opening is formed in a partial region of the third interlayer film 530 by photolithography and etching, metals such as Ti and Al are stacked in the opening, and then patterning is performed, so that the source electrode 300 and the drain electrode 400 are formed.

Note that in the step of forming the opening in the partial region of the third interlayer film 530, recesses may be formed in the carrier transit layer 110 by etching the carrier transit layer 110 at the same time. In such a case, the distance between the source electrode 300 and the drain electrode 400, and the two-dimensional electron gas layer can be made shorter, which can further reduce contact resistance of the source electrode 300 and the drain electrode 400.

Figure 8:
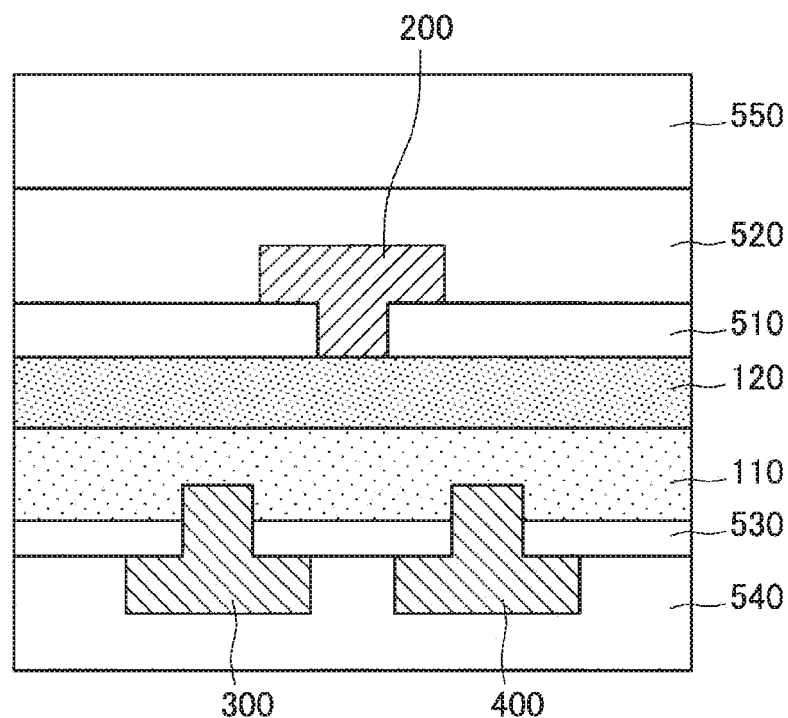
FIG. 8 is a cross-sectional view of a production step of the transistor illustrated in FIG. 2.

Subsequently, as illustrated in FIG. 8, on the source electrode 300 and the drain electrode 400, the fourth interlayer film 540 is stacked over the entire surface by CVD or the like. Like the first interlayer film 510, the fourth interlayer film 540 may be formed as, for example, a single-layer film of SiN, $Si_3N_4$, SiO, $SiO_2$, $Al_2O_3$, or the like, or a stacked film of these. Note that various wirings (not illustrated) may be formed in the fourth interlayer film 540 as needed.

Furthermore, the support substrate 550 is removed; thus, the transistor 1A according to the present embodiment illustrated in FIG. 2 is produced. Note that a method similar to that for the removal of the substrate 500 may be used for the removal of the support substrate 550.

1.3. Modification Examples

Now, modification examples of the transistor 1 according to the present embodiment will be described with reference to FIGS. 9 to 11. Transistors according to the present modification examples are transistors having gate structures different from that of the transistor 1 illustrated in FIG. 2. Note that details of a configuration denoted by the same reference numeral as in FIG. 2 are substantially similar to details described in FIG. 2; thus, description is omitted here.

Figure 9:
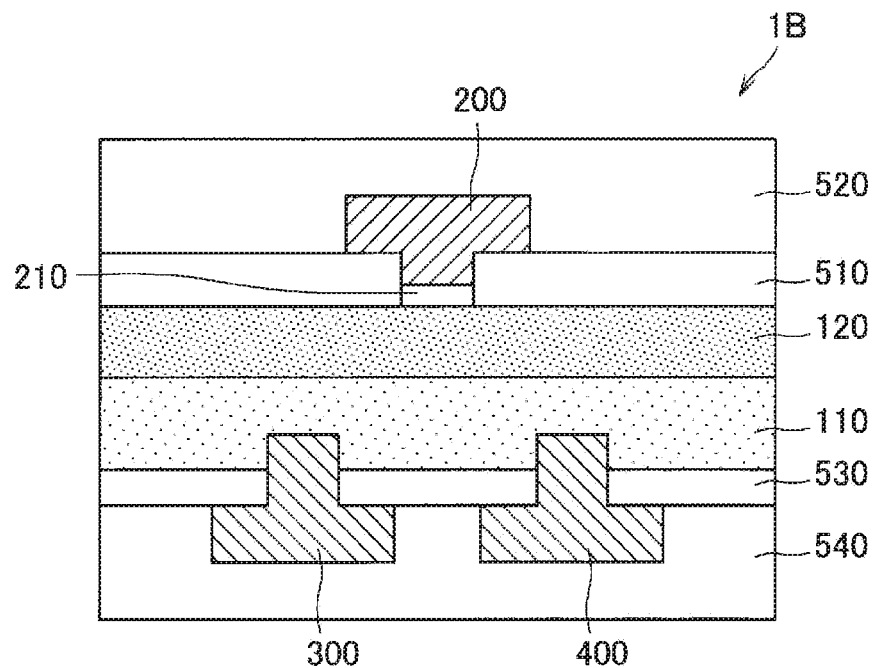
FIG. 9 is a cross-sectional view of a stacked structure of a transistor having a MIS gate.

FIG. 9 is a cross-sectional view of a stacked structure of a transistor 1B having a metal-insulator-semiconductor (MIS) gate. In addition, FIG. 10 is a cross-sectional view of a stacked structure of a transistor 1C having a second-conductivity-type (e.g., p-type) gate. FIG. 11 is a cross-sectional view of a stacked structure of a transistor 1D having a recess gate.

As illustrated in FIG. 9, in the transistor 1B according to a modification example of the present embodiment, the gate electrode 200 is provided on the carrier supply layer 120 with an insulating layer 210 therebetween.

The insulating layer 210 includes a dielectric having insulation properties. For example, the insulating layer 210 may be formed using $SiO_2$ or $Al_2O_3$ by CVD or atomic layer deposition (ALD). In the transistor 1B according to the present modification example, the MIS gate is formed by the gate electrode 200 being provided on the carrier supply layer 120 with the insulating layer 210 therebetween.

With the MIS gate, in the case where voltage is applied to the gate electrode 200, carriers are drawn near an interface between the carrier supply layer 120 and the insulating layer 210, and an inversion layer is formed. Consequently, in the transistor 1B according to the present modification example, electron concentration of the two-dimensional electron gas layer can be controlled by controlling a thickness of the inversion layer, so that an amount of current that flows between the source electrode 300 and the drain electrode 400 can be controlled.

In the transistor 1B having such a MIS gate, the gate structure is improved in withstand voltage, so that higher voltage can be applied to the gate electrode 200, as compared with the transistor 1A having a Schottky gate illustrated in FIG. 2.

Figure 10:
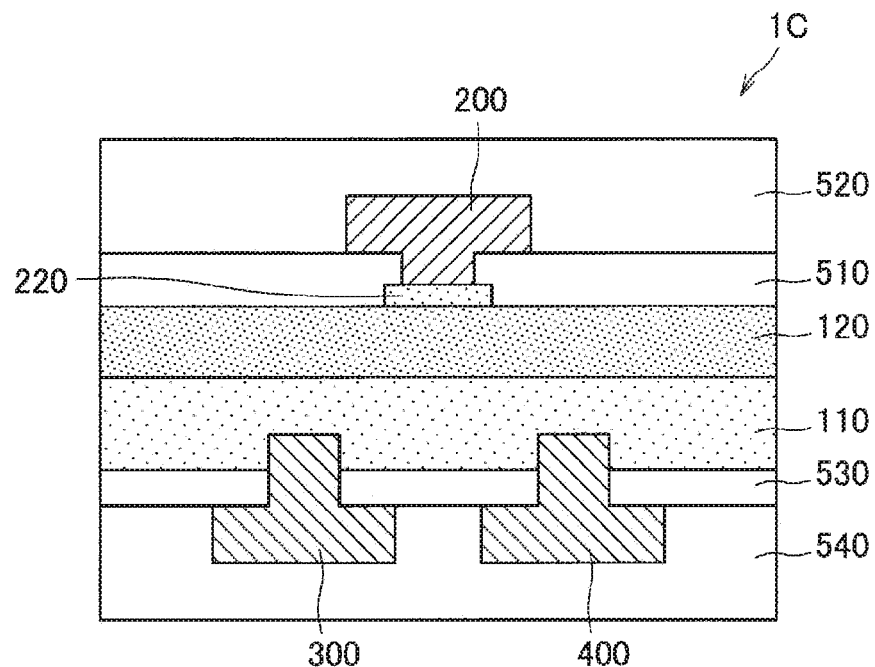
FIG. 10 is a cross-sectional view of a stacked structure of a transistor having a second-conductivity-type gate.

Meanwhile, as illustrated in FIG. 10, in the transistor 1C according to another modification example of the present embodiment, the gate electrode 200 is provided on the carrier supply layer 120 with a semiconductor layer 220 therebetween.

The semiconductor layer 220 is formed using a second-conductivity-type (e.g., p-type) semiconductor. For example, the semiconductor layer 220 may be formed by causing epitaxial growth of GaN additionally containing magnesium (Mg), which is a p-type impurity, on the carrier supply layer 120. In addition, the semiconductor layer 220 may be formed by doping the vicinity of a surface of the carrier supply layer 120 with magnesium (Mg) or the like, which is a p-type impurity. In the transistor 1C according to the present modification example, the second-conductivity-type (p-type) gate is formed by the gate electrode 200 being provided on the carrier supply layer 120 with the semiconductor layer 220 therebetween.

With the second-conductivity-type gate, a pn junction forms a depletion layer at an interface between the semiconductor layer 220 and the carrier supply layer 120. Therefore, electron concentration of the two-dimensional electron gas layer can be controlled, by changing voltage applied to the gate electrode 200 to control a thickness of the depletion layer formed in the carrier supply layer 120. Consequently, in the transistor 1C according to the present modification example, electron concentration of the two-dimensional electron gas layer can be controlled from the thickness of the depletion layer by controlling voltage applied to the gate electrode 200, so that an amount of current that flows between the source electrode 300 and the drain electrode 400 can be controlled.

In the transistor 1C having such a second-conductivity-type gate, threshold voltage can be made higher, so that normally-off operation can be achieved more easily, as compared with the transistor 1A having the Schottky gate illustrated in FIG. 2. In addition, in the transistor 1C having the second-conductivity-type gate, reverse withstand voltage of the gate can be made higher than that of the Schottky gate; thus, leakage current can be suppressed.

Figure 11:
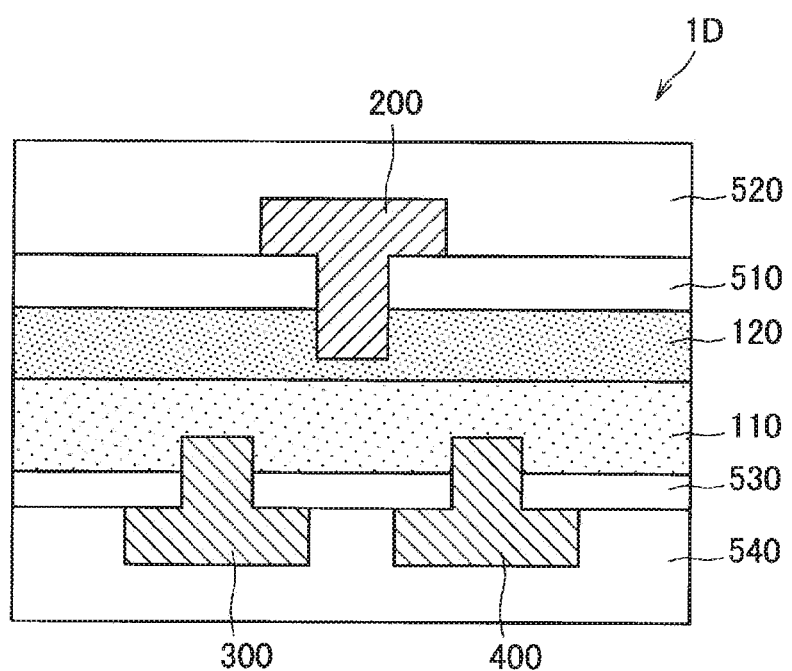
FIG. 11 is a cross-sectional view of a stacked structure of a transistor having a recess gate.

In addition, as illustrated in FIG. 11, in the transistor 1D according to another modification example of the present embodiment, the gate electrode 200 is provided by removal of part of the carrier supply layer 120 below the gate electrode 200. Specifically, a recess is formed in the carrier supply layer 120 by removing part thereof, and the gate electrode 200 is provided to embed the recess of the carrier supply layer 120.

For example, in the case where the carrier supply layer 120 includes AlGaN and the carrier transit layer 110 includes GaN, in the transistor 1D, electron concentration of the two-dimensional electron gas layer directly under the carrier supply layer 120 can be reduced by influence of a piezoelectric effect or the like, by reducing a film thickness of the carrier supply layer 120.

In the transistor 1D having such a recess gate, threshold voltage of the transistor can be controlled appropriately by controlling the film thickness of the carrier supply layer 120 directly under the gate electrode 200.

2. SECOND EMBODIMENT

Figure 12:
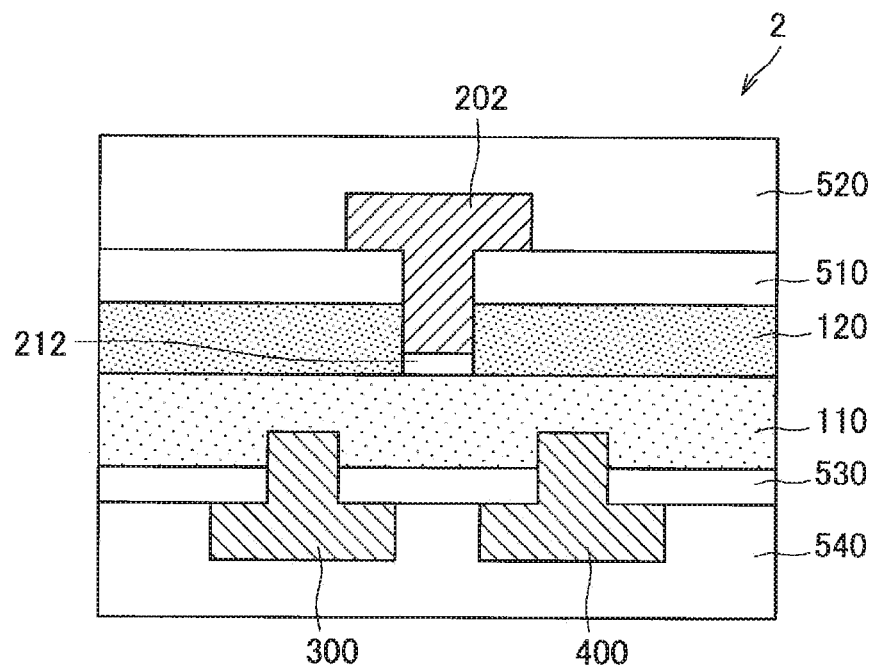
FIG. 12 is a cross-sectional view of a stacked structure of a transistor according to a second embodiment of the present disclosure.

Next, a transistor 2 according to a second embodiment of the present disclosure is described with reference to FIG. 12. FIG. 12 is a cross-sectional view of a stacked structure of the transistor 2 according to the present embodiment. Note that details of a configuration denoted by the same reference numeral as in FIG. 2 are substantially similar to details described in FIG. 2; thus, description is omitted here.

As illustrated in FIG. 12, in the transistor 2 according to the present embodiment, the carrier supply layer 120 is provided with an opening, and a gate electrode 202 penetrates the carrier supply layer 120 through the opening. In addition, the gate electrode 202 is in contact with the carrier transit layer 110 via an insulating layer 212.

The gate electrode 202 penetrates the carrier supply layer 120 through the opening provided in the carrier supply layer 120, and is in contact with the carrier transit layer 110 via the insulating layer 212. Note that a material of the gate electrode 202 is similar to that of the gate electrode 200 illustrated in FIG. 2.

The insulating layer 212 includes a dielectric having insulation properties. For example, the insulating layer 212 may be formed using $SiO_2$ or $Al_2O_3$ by CVD or ALD.

That is, in the transistor 2 according to the present embodiment, the carrier supply layer 120 is not provided in a region directly under the gate electrode 202, and a MIS gate using the insulating layer 212 is provided. With such a configuration, in the case where voltage is applied to the gate electrode 202, the MIS gate forms a channel including an inversion layer in the carrier transit layer 110 directly under the gate electrode 202. This enables the transistor 2 according to the present embodiment to function as a field-effect transistor.

In the transistor 2 according to the present embodiment, a high-mobility two-dimensional electron gas layer can be used for electrical connection between the channel formed by the MIS gate, and the source electrode 300 and the drain electrode 400; thus, on-resistance of the transistor 2 can be reduced.

3. THIRD EMBODIMENT

Figure 13:
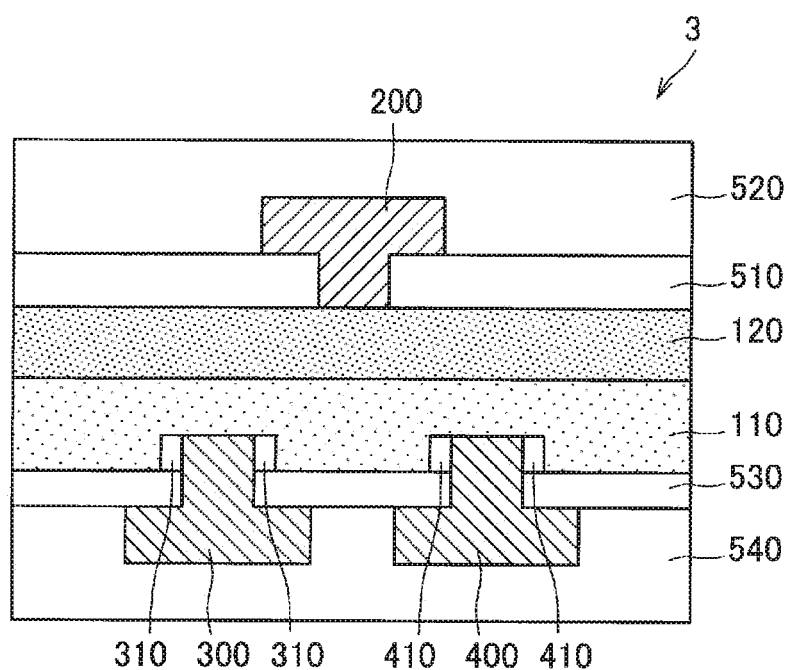
FIG. 13 is a cross-sectional view of a stacked structure of a transistor according to a third embodiment of the present disclosure.

Now, a transistor 3 according to a third embodiment of the present disclosure will be described with reference to FIG. 13. FIG. 13 is a cross-sectional view of a stacked structure of the transistor 3 according to the present embodiment. Note that details of a configuration denoted by the same reference numeral as in FIG. 2 are substantially similar to details described in FIG. 2; thus, description is omitted here.

As illustrated in FIG. 13, in the transistor 3 according to the present embodiment, insulating films 310 and 410 are provided on side faces of recesses of the carrier transit layer 110 that are embedded by the source electrode 300 and the drain electrode 400.

The insulating films 310 and 410 include a material having insulation properties. For example, the insulating films 310 and 410 may be formed by, after forming recesses in the carrier transit layer 110, embedding the recesses of the carrier transit layer 110 with insulating films including $SiO_2$ or $Al_2O_3$ by CVD or the like, and further performing etching with perpendicular anisotropy. That is, the insulating films 310 and 410 may be formed as sidewalls of the recesses. At this time, the insulating films at bottom faces of the recesses do not need to be entirely removed, and the source electrode 300 and the drain electrode 400 may be in contact with the carrier transit layer 110 in a state where the insulating films at the bottom faces of the recesses are partly removed.

In the transistor 3 according to the present embodiment, forming the insulating films 310 and 410 on the side faces of the recesses can suppress formation of a current path from side faces of the source electrode 300 and the drain electrode 400. Consequently, in the transistor 3 according to the present embodiment, occurrence of leakage current between the source electrode 300 and the drain electrode 400 when the transistor is off can be particularly suppressed.

4. FOURTH EMBODIMENT

Figure 14:
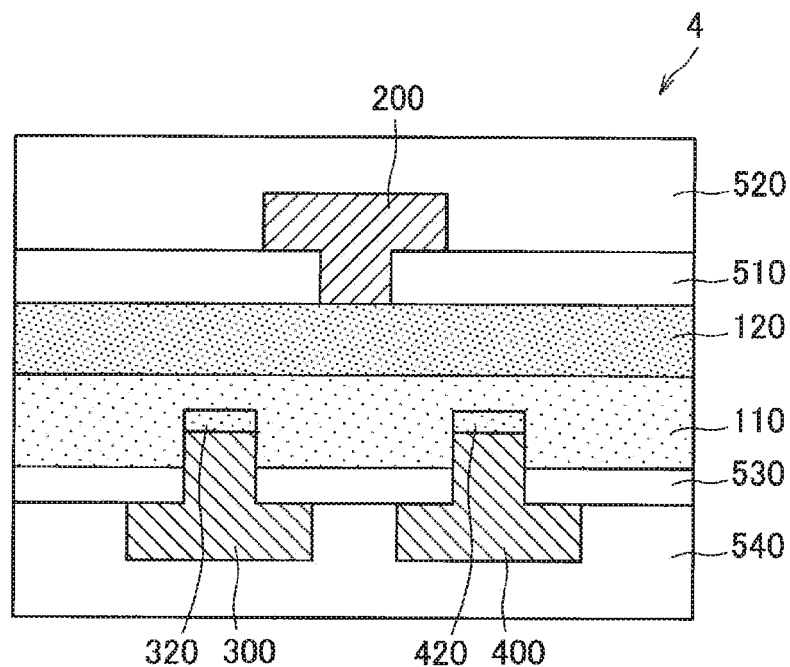
FIG. 14 is a cross-sectional view of a stacked structure of a transistor according to a fourth embodiment of the present disclosure.

Next, a transistor 4 according to a fourth embodiment of the present disclosure is described with reference to FIG. 14. FIG. 14 is a cross-sectional view of a stacked structure of the transistor 4 according to the present embodiment. Note that details of a configuration denoted by the same reference numeral as in FIG. 2 are substantially similar to details described in FIG. 2; thus, description is omitted here.

As illustrated in FIG. 14, in the transistor 4 according to the present embodiment, first-conductivity-type (e.g., n-type) regions 320 and 420 are provided on bottom faces of recesses of the carrier transit layer 110 that are embedded by the source electrode 300 and the drain electrode 400.

The first-conductivity-type regions 320 and 420 are first-conductivity-type regions having a higher concentration than a concentration of a first-conductivity-type impurity of the carrier transit layer 110. For example, the first-conductivity-type regions 320 and 420 can be formed by performing ion implantation of the first-conductivity-type impurity such as Si on the carrier transit layer 110 at the bottom faces of the recesses, and then performing activation by annealing.

In addition, in the case where the carrier transit layer 110 includes GaN, the first-conductivity-type regions 320 and 420 may be formed by using a metal such as Ti for bottoms of the source electrode 300 and the drain electrode 400 and causing the metal to react with GaN. A metal such as Ti extracts nitrogen (N) from a nitride such as GaN; thus, the carrier transit layer 110 in contact with the bottoms of the source electrode 300 and the drain electrode 400 is made first-conductivity-type by a loss of nitrogen. Also in the case where such a method is used, the first-conductivity-type regions 320 and 420 can be formed.

In the transistor 4 according to the present embodiment, forming the first-conductivity-type regions 320 and 420 on side faces on bottom faces of the recesses can lower the Schottky barrier between the source electrode 300 and the drain electrode 400, and the carrier transit layer 110. Consequently, in the transistor 4 according to the present embodiment, a favorable ohmic junction can be formed between the source electrode 300 and the drain electrode 400, and the carrier transit layer 110, which can further reduce contact resistance.

5. FIFTH EMBODIMENT

Figure 15:
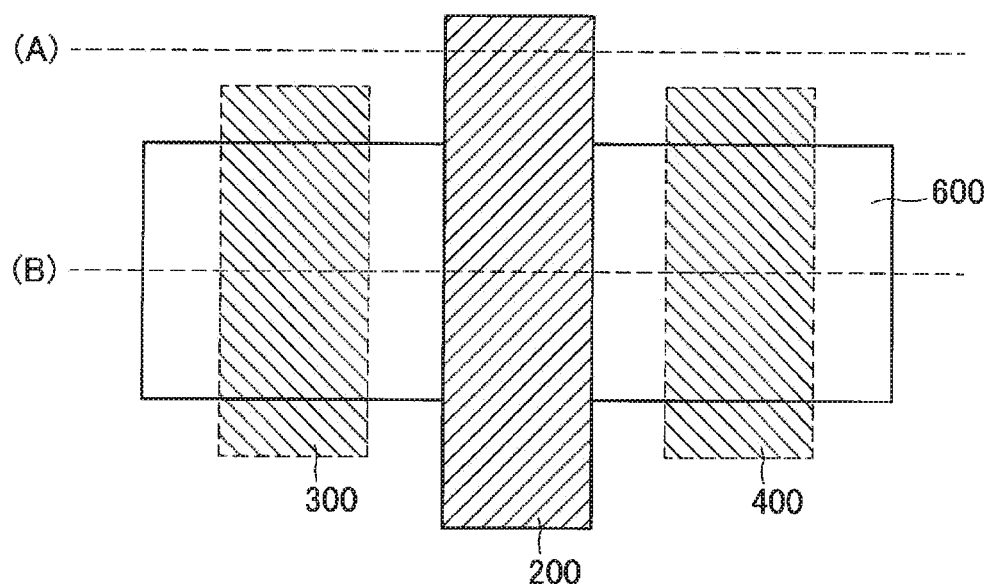
FIG. 15 is a plan view of a planar structure of a transistor according to a fifth embodiment of the present disclosure.
Figure 16:
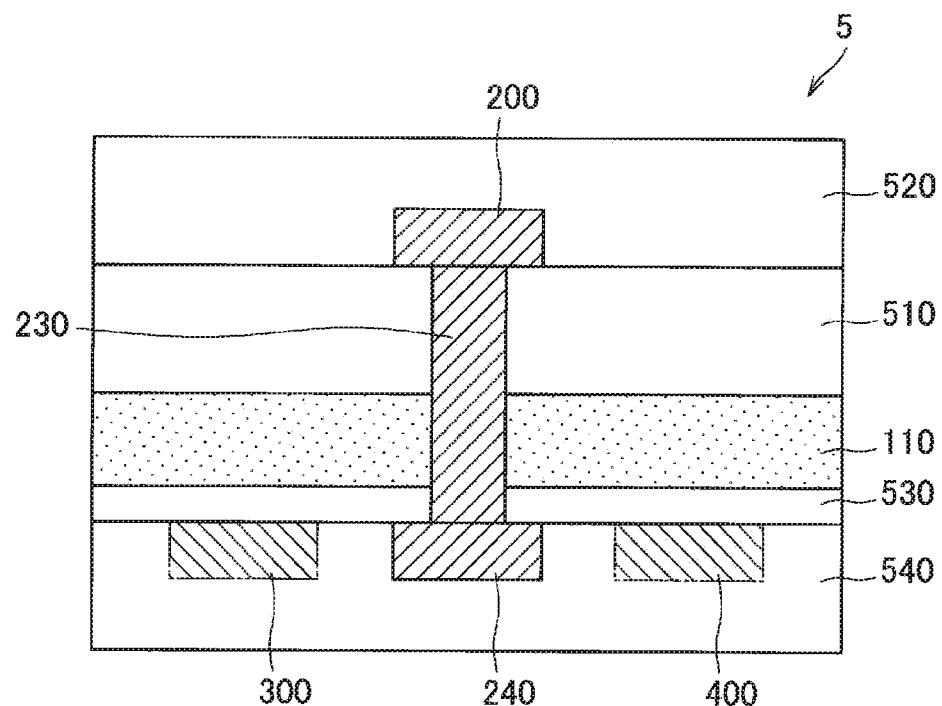
FIG. 16 is a cross-sectional view of the transistor according to the embodiment taken along a section line (A) of FIG. 15.

Now, a transistor 5 according to a fifth embodiment of the present disclosure will be described with reference to FIGS. 15 and 16. FIG. 15 is a plan view of a planar structure of the transistor 5 according to the present embodiment, and FIG. 16 is a cross-sectional view of the transistor 5 according to the present embodiment taken along a section line (A) of FIG. 15. Note that details of a configuration denoted by the same reference numeral as in FIG. 2 are substantially similar to details described in FIG. 2; thus, description is omitted here.

As illustrated in FIG. 15, the transistor 5 according to the present embodiment is provided on a section line (B) of a transistor region 600. Note that a cross-sectional view of the transistor 5 taken along the section line (B) may be any of those of the first to fourth embodiments. In addition, an element isolation region having high insulation properties is formed around the transistor region 600 to isolate the transistor 5 from other elements.

The element isolation region is formed by, for example, removing the carrier supply layer 120 of a corresponding region and then embedding the region from which the carrier supply layer 120 has been removed with an insulator such as $SiO_2$. Note that the step of embedding the insulator may be performed at the same time as the step of forming the first interlayer film 510 and the like. In addition, the element isolation region may be formed by, for example, performing ion implantation of the second-conductivity-type impurity (boron or the like) on the carrier supply layer 120 to break the hetero interface between the carrier supply layer 120 and the carrier transit layer 110 and increase resistance.

Here, FIG. 16 shows a cross-sectional view of the transistor 5 according to the present embodiment taken along (A) of FIG. 15. As illustrated in FIG. 16, the transistor 5 according to the present embodiment further includes an extraction electrode 230 connected to the gate electrode 200 and a wiring layer 240 connected to the extraction electrode 230.

The extraction electrode 230 penetrates the carrier transit layer 110 to jut from the surface of the carrier transit layer 110 on which the source electrode 300 and the drain electrode 400 are provided. In addition, the wiring layer 240 is provided on the same surface as the surface of the carrier transit layer 110 on which the source electrode 300 and the drain electrode 400 are provided.

In the transistor 5 according to the present embodiment, the extraction electrode 230 and the wiring layer 240 enable voltage application to the gate electrode 200 to be performed from the same surface as the surface on which the source electrode 300 and the drain electrode 400 are provided. This facilitates routing of wirings between the transistor 5 according to the present embodiment and other elements.

6. CONCLUSION

As described above, in the transistor according to each of the embodiments of the present disclosure, the source electrode 300 and the drain electrode 400 are provided on the other surface of the carrier transit layer 110 that is opposite to the one surface on which the carrier supply layer 120 is provided. Thus, the transistor according to each of the embodiments of the present disclosure can reduce contact resistance between the source electrode 300 and the drain electrode 400, and the two-dimensional electron gas layer.

In addition, in the transistor according to each of the embodiments of the present disclosure, since the gate electrode 200, and the source electrode 300 and the drain electrode 400 are provided on different surfaces opposite to each other, parasitic capacitance can be reduced as compared with a case where the electrodes are provided on the same surface. Thus, the transistor according to each of the embodiments of the present disclosure can perform operation at higher speed.

Furthermore, in the transistor according to each of the embodiments of the present disclosure, since the gate electrode 200, and the source electrode 300 and the drain electrode 400 are provided on different surfaces opposite to each other, a planar area of the transistor 1 can be reduced, regardless of a design rule (minimum feature size) between the source electrode 300 and the drain electrode 400, and the gate electrode 200.

The transistor according to each of the embodiments of the present disclosure can be suitably used for, for example, a radio frequency (RF) module used for a wireless communication apparatus etc., a power conversion module used for a power conditioner etc., or the like. In addition, a mobile phone and a smartphone that include a radio frequency module including the transistor according to each of the embodiments of the present disclosure also belong to the technical scope of the present disclosure. Furthermore, needless to say, an alternating current-direct current (AC-DC) or direct current-direct current (DC-DC) converter, such as an alternating current (AC) adapter or a power conditioner, that includes a power conversion module including the transistor according to each of the embodiments of the present disclosure also belongs to the technical scope of the present disclosure.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)
A transistor including:
a carrier transit layer including a compound semiconductor;
a carrier supply layer provided on and in contact with the carrier transit layer and including a compound semiconductor of a different type from the carrier transit layer;
a gate electrode provided on the carrier supply layer; and
a source electrode and a drain electrode provided on another surface of the carrier transit layer that is opposite to one surface on which the carrier supply layer is provided.
(2)
The transistor according to (1), in which a band gap of the carrier transit layer is smaller than a band gap of the carrier supply layer.
(3)
The transistor according to (1) or (2), in which the source electrode and the drain electrode are provided to embed recesses provided on the other surface of the carrier transit layer.
(4)
The transistor according to (3), in which an insulating film is provided on a sidewall of the recess.
(5)
The transistor according to (3) or (4), in which a first-conductivity-type region having a higher concentration than a concentration of a first-conductivity-type impurity of the carrier transit layer is provided at a bottom of the recess.
(6)
The transistor according to any one of (1) to (5), in which the gate electrode is provided on the carrier supply layer with an insulating layer provided between the gate electrode and the carrier supply layer.
(7)
The transistor according to any one of (1) to (5), in which the gate electrode is provided on the carrier supply layer with a second-conductivity-type semiconductor film provided between the gate electrode and the carrier supply layer.
(8)
The transistor according to any one of (1) to (5), in which the carrier supply layer is provided with a second-conductivity-type region of a second conductivity type, and the gate electrode is provided on the second-conductivity-type region.
(9)
The transistor according to any one of (1) to (5), in which
the carrier supply layer is provided with an opening, and
the gate electrode is provided to penetrate the carrier supply layer through the opening and be in contact with the carrier transit layer via an insulating layer.
(10)
The transistor according to any one of (1) to (9), further including
an extraction electrode that is electrically connected to the gate electrode and penetrates the carrier transit layer to jut from a surface on which the source electrode and the drain electrode are provided.
(11)
A semiconductor device including
a transistor including
a carrier transit layer including a compound semiconductor,
a carrier supply layer provided on and in contact with the carrier transit layer and including a compound semiconductor of a different type from the carrier transit layer, a gate electrode provided on the carrier supply layer, and
a source electrode and a drain electrode provided on another surface of the carrier transit layer that is opposite to one surface on which the carrier supply layer is provided.

(12)
An electronic apparatus including
a transistor including
a carrier transit layer including a compound semiconductor,
a carrier supply layer provided on and in contact with the carrier transit layer and including a compound semiconductor of a different type from the carrier transit layer,
a gate electrode provided on the carrier supply layer, and
a source electrode and a drain electrode provided on another surface of the carrier transit layer that is opposite to one surface on which the carrier supply layer is provided.

(13)
A method for producing a transistor, including:
stacking a carrier transit layer and a carrier supply layer including compound semiconductors of different types in sequence on a substrate;
forming a gate electrode on the carrier supply layer;
removing the substrate; and
forming a source electrode and a drain electrode on another surface of the carrier transit layer that is opposite to one surface on which the carrier supply layer is provided.

(14)
The method for producing a transistor according to (13), in which a material of the substrate is different from materials of the carrier transit layer and the carrier supply layer.

(15)
The method for producing a transistor according to (14), in which the material of the substrate is one of silicon carbide, sapphire, silicon, diamond, and gallium arsenide.

REFERENCE SIGNS LIST 1 transistor
110 carrier transit layer
120 carrier supply layer
130 buffer layer
200 gate electrode
300 source electrode
400 drain electrode
500 substrate
510 first interlayer film
520 second interlayer film
530 third interlayer film
540 fourth interlayer film
550 support substrate

The invention claimed is:

1. A transistor, comprising:
a carrier transit layer that includes a first compound semiconductor;
a carrier supply layer on and in contact with a first surface of the carrier transit layer, wherein
the carrier supply layer includes a second compound semiconductor, and
the second compound semiconductor is different from the first compound semiconductor;
a gate electrode on the carrier supply layer, wherein the gate electrode is embedded in a recess in the carrier supply layer;
a source electrode and a drain electrode on a second surface of the carrier transit layer, wherein
the second surface is opposite to the first surface of the carrier transit layer, and
the source electrode and the drain electrode are embedded in recesses on the second surface of the carrier transit layer; and
an insulating film on sidewalls of the recesses in the carrier transit layer, such that the insulating film is between each of the source electrode and the drain electrode and the sidewalls of the recesses.

2. The transistor according to claim 1, wherein a band gap of the carrier transit layer is smaller than a band gap of the carrier supply layer.

3. The transistor according to claim 1, further comprising first-conductivity-type regions at bottom faces of the recesses, wherein the first-conductivity-type regions have a higher concentration than a concentration of a first-conductivity-type impurity of the carrier transit layer.

4. The transistor according to claim 1, further comprising an insulating layer between the gate electrode and the carrier supply layer.

5. The transistor according to claim 1, further comprising a second-conductivity-type semiconductor film between the gate electrode and the carrier supply layer.

6. The transistor according to claim 1, wherein
the carrier supply layer includes a second-conductivity-type region of a second conductivity type, and
the gate electrode is on the second-conductivity-type region.

7. The transistor according to claim 1, wherein
the carrier supply layer includes an opening,
the gate electrode is configured to penetrate the carrier supply layer through the opening and contact the carrier transit layer via an insulating layer, and
the insulating layer is between the gate electrode and a portion of the carrier transit layer in a stacking direction of the carrier supply layer and the carrier transit layer, such that the portion of the carrier transit layer is below the insulating layer in the stacking direction.

8. The transistor according to claim 1, further comprising an extraction electrode that is electrically connected to the gate electrode, wherein the extraction electrode is configured to penetrate the carrier transit layer to jut from both the first surface and the second surface of the carrier transit layer.

9. The transistor according to claim 8, further comprising a wiring layer on the second surface of the carrier transit layer, wherein the extraction electrode is further configured to connect to the wiring layer.

10. A semiconductor device, comprising:
a transistor that includes:
a carrier transit layer including a first compound semiconductor;
a carrier supply layer on and in contact with a first surface of the carrier transit layer, wherein
the carrier supply layer includes a second compound semiconductor, and
the second compound semiconductor is different from the first compound semiconductor;
a gate electrode on the carrier supply layer, wherein the gate electrode is embedded in a recess in the carrier supply layer;
a source electrode and a drain electrode on a second surface of the carrier transit layer, wherein
the second surface is opposite to the first surface of the carrier transit layer, and
the source electrode and the drain electrode are embedded in recesses on the second surface of the carrier transit layer; and an insulating film on sidewalls of the recesses in the carrier transit layer, such that the insulating film is between each of the source electrode and the drain electrode and the sidewalls of the recesses.

11. An electronic apparatus, comprising:
a transistor that includes:
  a carrier transit layer that includes a first compound semiconductor;
  a carrier supply layer on and in contact with a first surface of the carrier transit layer, wherein
    the carrier supply layer includes a second compound semiconductor, and
    the second compound semiconductor is different from the first compound semiconductor;
  a gate electrode on the carrier supply layer, wherein the gate electrode is embedded in a recess in the carrier supply layer;
  a source electrode and a drain electrode on a second surface of the carrier transit layer, wherein
    the second surface is opposite to the first surface of the carrier transit layer, and
    the source electrode and the drain electrode are embedded in recesses on the second surface of the carrier transit layer; and
  an insulating film on sidewalls of the recesses in the carrier transit layer, such that the insulating film is between each of the source electrode and the drain electrode and the sidewalls of the recesses.

12. A method for producing a transistor, comprising:
stacking a carrier transit layer and a carrier supply layer in sequence on a substrate, wherein
  the carrier supply layer is on and in contact with a first surface of the carrier transit layer,
  the carrier transit layer includes a first compound semiconductor,
  the carrier supply layer includes a second compound semiconductor, and
  the first compound semiconductor is different from the second compound semiconductor;
forming a gate electrode on the carrier supply layer, wherein
  a recess is formed on the carrier supply layer, and
  the gate electrode is embedded in the recess;
removing the substrate;
forming a source electrode and a drain electrode on a second surface of the carrier transit layer, wherein
  the second surface is opposite to the first surface of the carrier transit layer; and
  the source electrode and the drain electrode are embedded in recesses on the second surface of the carrier transit layer; and
forming an insulating film on sidewalls of the recesses in the carrier transit layer, such that the insulating film is between each of the source electrode and the drain electrode and the sidewalls of the recesses.

13. The method according to claim 12, wherein a material of the substrate is different from materials of the carrier transit layer and the carrier supply layer.

14. The method according to claim 13, wherein the material of the substrate is one of silicon carbide, sapphire, silicon, diamond, or gallium arsenide.

* * * * *